(12) United States Patent
Sung

(10) Patent No.: US 12,140,626 B2
(45) Date of Patent: Nov. 12, 2024

(54) TEST CIRCUIT OF ELECTRONIC DEVICE, ELECTRONIC DEVICE INCLUDING TEST CIRCUIT, AND OPERATING METHOD THEREOF

(71) Applicant: SK hynix Inc., Gyeonggi-do (KR)

(72) Inventor: Ki Hyuk Sung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 74 days.

(21) Appl. No.: 17/990,119

(22) Filed: Nov. 18, 2022

(65) Prior Publication Data

US 2023/0384369 A1 Nov. 30, 2023

(30) Foreign Application Priority Data

May 25, 2022 (KR) .................. 10-2022-0064314

(51) Int. Cl.
*G01R 31/316* (2006.01)
*H03K 17/687* (2006.01)

(52) U.S. Cl.
CPC ....... *G01R 31/316* (2013.01); *H03K 17/6871* (2013.01)

(58) Field of Classification Search
CPC .............. G01R 31/316; G01R 31/2836; G01R 31/2884; G01R 31/31724; G01R 31/31713; G01R 31/31715; H03K 17/6871; H03K 17/693; H03K 17/005
See application file for complete search history.

(56) References Cited

U.S. PATENT DOCUMENTS

| 5,892,387 | A | * | 4/1999 | Shigehara | .......... H03K 17/6872 327/434 |
| 6,677,779 | B1 | | 1/2004 | Su et al. | |
| 7,206,547 | B2 | | 4/2007 | Voutilainen et al. | |
| 2002/0180630 | A1 | * | 12/2002 | Eguchi | .................. H03M 1/108 341/154 |
| 2005/0070269 | A1 | * | 3/2005 | Voutilainen | ............. H04M 1/24 455/67.11 |
| 2008/0024192 | A1 | * | 1/2008 | Kase | .................... H03K 17/693 327/407 |
| 2013/0106491 | A1 | * | 5/2013 | Ryu | ..................... H03K 17/005 327/407 |

* cited by examiner

Primary Examiner — Alvaro E Fortich
(74) Attorney, Agent, or Firm — IP & T GROUP LLP

(57) ABSTRACT

Provided herein may be a test circuit of an electronic device, the electronic device including the test circuit, and an operating method thereof. The electronic device may include analog circuits, a control circuit configured to connect, to an output terminal, each of a plurality of nodes respectively included in the analog circuits to an output terminal, a control signal generator configured to generate a control signal for controlling the control circuit based on an input signal received from an external device, and a switching circuit disposed on an electrical path for connecting the plurality of nodes and the control circuit to each other and configured to be electrically open during a preset time amount from a time point at which a voltage from an external power source starts to be applied to the control circuit.

20 Claims, 8 Drawing Sheets

TEST CIRCUIT OF ELECTRONIC DEVICE, ELECTRONIC DEVICE INCLUDING TEST CIRCUIT, AND OPERATING METHOD THEREOF

CROSS-REFERENCE TO RELATED APPLICATION

The present application claims priority under 35 U.S.C. § 119(a) to Korean patent application number 10-2022-0064314, filed on May 25, 2022, the entire disclosure of which is incorporated herein by reference.

BACKGROUND

Field of Invention

Various embodiments of the present disclosure generally relate to an electronic device, and more particularly to a test circuit of an electronic device, the electronic device including the test circuit, and an operating method thereof.

Description of Related Art

An electronic device may include an analog circuit, which may output a signal having various voltage levels.

In order to test the performance or operating states of analog circuits, the output terminal (or analog terminal bus) of the electronic device may be used. A test control circuit included in the electronic device may receive voltage from an external power source, and may be operated using the voltage. The external power source may be set such that the voltage increases from 0 V to a designated voltage.

SUMMARY

Various embodiments of the present disclosure are directed to a test circuit of an electronic device, which is capable of preventing the occurrence of malfunctioning, the electronic device including the test circuit, and an operating method thereof.

An embodiment of the present disclosure may provide for an electronic device. The electronic device may include analog circuits, a control circuit configured to connect, to an output terminal, each of a plurality of nodes respectively included in the analog circuits, a control signal generator configured to generate a control signal for controlling the control circuit based on an input signal received from an external device, and a switching circuit disposed on an electrical path for connecting the plurality of nodes and the control circuit to each other and configured to be electrically open during a preset time amount from a time point at which a voltage from an external power source starts to be applied to the control circuit.

An embodiment of the present disclosure may provide for a test circuit for controlling a test operation for analog circuits. The test circuit may include a control circuit configured to connect, to an output terminal, each of a plurality of nodes respectively included in the analog circuits, a control signal generator configured to generate a control signal for controlling the control circuit based on an input signal received from an external device, and a switching circuit disposed on an electrical path for connecting the plurality of nodes and the control circuit to each other and configured to be electrically open during a preset time amount from a time point at which a voltage from an external power source starts to be applied to the control circuit.

DETAILED DESCRIPTION

Specific structural or functional descriptions in the embodiments of the present disclosure introduced in this specification are provided as examples to describe embodiments according to the concept of the present disclosure. The embodiments according to the concept of the present disclosure may be practiced in various forms, and should not be construed as being limited to the embodiments described in the specification.

Figure 1:
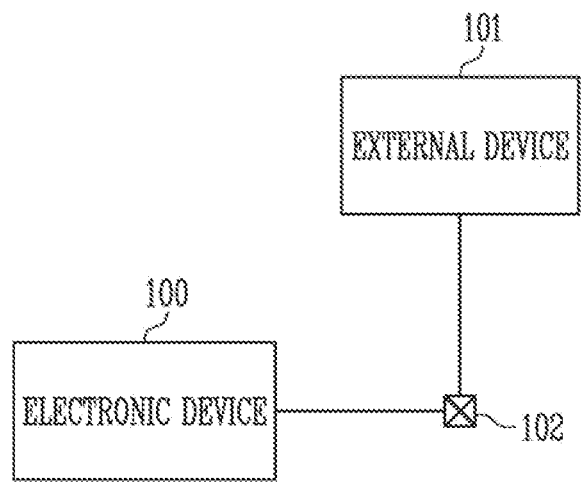
FIG. 1 is a diagram illustrating a state in which an electronic device is connected to an external device through an output terminal according to an embodiment of the present disclosure.

FIG. 1 is a diagram illustrating a state in which an electronic device 100 is connected to an external device 101 through an output terminal 102 according to an embodiment of the present disclosure.

Referring to FIG. 1, the electronic device 100 may be a semiconductor device. The output of an analog circuit (not illustrated) included in the electronic device 100 may be transferred to the output terminal 102 of the electronic device 100, and in this case, the output terminal 102 may be an analog test bus (ATB) for testing an analog signal. The external device 101 may be electrically connected to the electronic device 100 through the output terminal 102. The external device 101 may be a test device for testing the electronic device 100. For example, the external device 101 may measure the output of at least one analog circuit included in the electronic device 100 through the output terminal 102. The external device 101 may test, using the results of measurement, whether analog circuits included in the electronic device 100 are correctly operated. The output value of each analog circuit measured by the external device 101 may be the voltage of a specific node included in the corresponding analog circuit.

In an embodiment, the electronic device 100 may be a semiconductor device including at least one analog circuit therein. For example, the electronic device 100 may include not only a volatile memory and a nonvolatile memory but also a memory controller, a storage device or a non-memory device. For example, the electronic device 100 may be implemented as any of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

Figure 2:
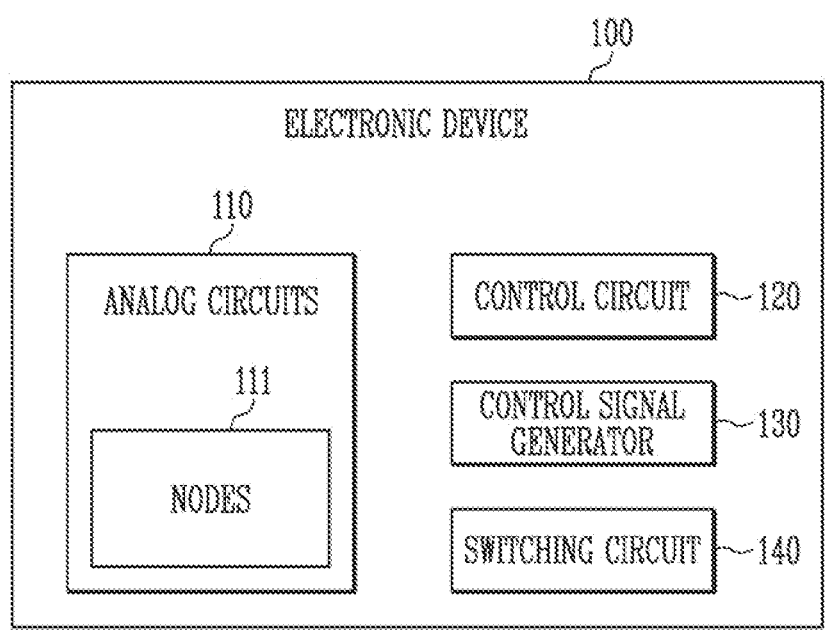
FIG. 2 is a diagram illustrating a hardware configuration of the electronic device of FIG. 1 according to an embodiment of the present disclosure.

FIG. 2 is a diagram illustrating the hardware configuration of the electronic device 100 of FIG. 1 according to an embodiment of the present disclosure.

Referring to FIG. 2, the electronic device 100 may include analog circuits 110, a control circuit 120, a control signal generator 130, and a switching circuit 140. The analog circuits 110 may be circuits designed using various elements, and may include a plurality of nodes 111 therein.

In an example, the analog circuits 110 may include two or more semiconductor intellectual property (IP) blocks. Such a semiconductor IP block may be a block for performing a specific function in the semiconductor device. In an embodiment, the analog circuits 110 may include a voltage generator which generates voltages, a temperature sensing circuit which measures temperature, an amplifier which amplifies the strength (voltage) of a signal, an impedance matching circuit which performs impedance matching, or a modulation circuit (modulator) which modulates the frequency or phase of a signal.

The control circuit 120 may be a circuit, which transfers the voltages of nodes included in the analog circuits 110 to the output terminal 102, described above with reference to FIG. 1, in response to an input control signal. In an embodiment, the control circuit 120 may include a plurality of controllers. In an embodiment, the plurality of controllers included in the control circuit 120 may be connected to the switching circuit 140. The plurality of controllers may connect or disconnect the switching circuit 140 to or from the output terminal 102, described above with reference to FIG. 1, in response to a control signal. In an embodiment, the plurality of controllers may be transistors such as metal-oxide semiconductor field-effect-transistors (MOSFETs) or bipolar junction transistors (BJTs). In this case, a plurality of transistors may respectively correspond to the nodes 111 included in the analog circuits 110 connected through the switching circuit 140.

The control signal generator 130 may provide the control signal to the control circuit 120. The control signal generator 130 may generate the control signal to be provided to the plurality of controllers included in the control circuit 120 in response to an externally received input signal. The control signal generator 130 may provide the generated control signal to the control circuit 120. Connection states of the plurality of controllers included in the control circuit 120 may be determined in response to the control signal provided by the control signal generator 130.

The switching circuit 140 may connect the nodes 111 included in the analog circuits 110 to the control circuit 120. The switching circuit 140 may include a plurality of switches which connect the plurality of controllers included in the control circuit 120 to the nodes 111 of the analog circuits 110, respectively. In an embodiment, the plurality of switches may be transistors.

Figure 3:
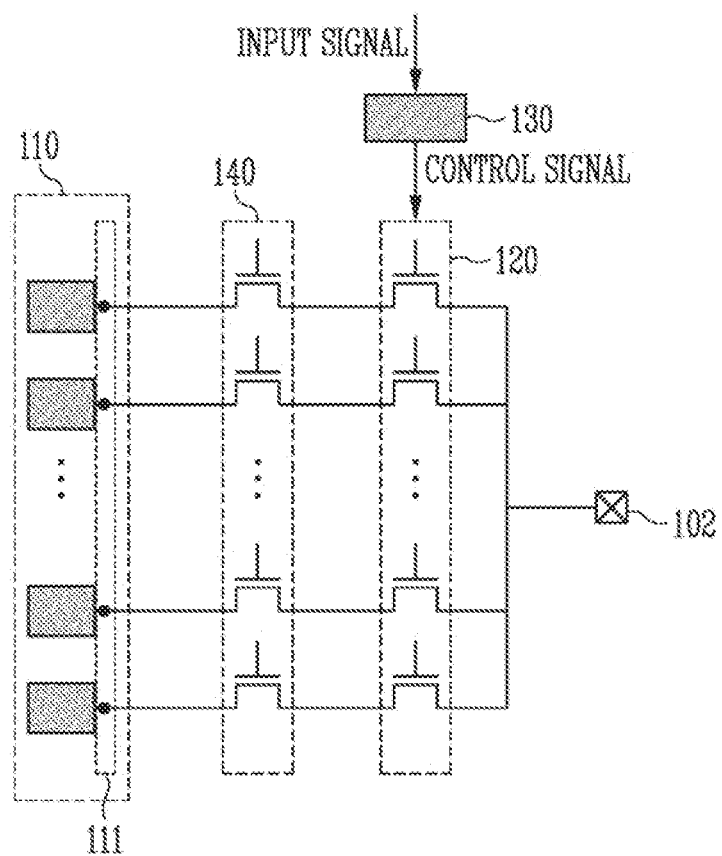
FIG. 3 is a diagram illustrating the operation of a test circuit according to an embodiment of the present disclosure.

FIG. 3 is a diagram illustrating the operation of a test circuit according to an embodiment of the present disclosure.

Referring to FIG. 3, the test circuit may include the control circuit 120, the control signal generator 130, and the switching circuit 140 as illustrated in FIG. 2. The test circuit may be included in the electronic device 100, which controls, in response to an input signal provided from the external test device 101, the analog circuits 110 to transfer the voltages of the plurality of nodes 111 to the output terminal 102.

The control signal generator 130 may generate a control signal in response to an externally received input signal. The externally received input signal may be a signal provided by the external device 101, described above with reference to FIG. 1. In an embodiment, the external device 101 may be a test device for testing the electronic device 100.

In an embodiment, the control signal generator 130 may generate a control signal having a high or low state in response to the input signal. The control signal generator 130 may provide the control signal to the control circuit 120.

The control circuit 120 may connect or disconnect the switching circuit 140 to or from the output terminal 102 based on the control signal. In an embodiment, controllers included in the control circuit 120 may be transistors such as MOSFETs. The control signal may be provided to gate electrodes of the transistors. The control signal having a high state may be a signal having a voltage higher than threshold voltages of the transistors. The control signal having a low state may be a signal having a voltage lower than the threshold voltages of the transistors. Therefore, when the control signal having a high state is provided to the gate electrode of each transistor, the corresponding transistor may be turned on, thus connecting the switching circuit 140 to the output terminal 102. On the other hand, when the control signal having a low state is provided to the gate electrode of each transistor, the corresponding transistor may be turned off, thus disconnecting the switching circuit 140 from the output terminal 102.

In an embodiment, the plurality of nodes 111 included in the analog circuits 110 may be electrically connected to the control circuit 120. For example, the plurality of nodes 111 may be nodes in which the operating states of the analog circuits 110 may be tested, among a large number of nodes included in the analog circuits 110. That is, the plurality of nodes 111 may be nodes at locations preset to test the analog circuits 110. That is, the analog circuits undergo various tests during a design and implementation process, but there is a need to test whether the analog circuits are normally operated even after being integrated or packaged into an electronic device or a semiconductor device. In order to test the voltages of nodes included in the most important portion or nodes in which the operating states of the analog circuits may be determined, among a large number of nodes included in the analog circuits, after a packaging step, the operating states of the analog circuits may be tested at any time by determining the nodes to be tested in advance and by connecting the nodes to be tested to an analog test bus through a metal line or the like. An embodiment of the present disclosure relates to a test circuit, which provides voltages output from the nodes to be tested to the analog test bus, and may provide a function of more stably and accurately performing a test operation.

In an embodiment, the switching circuit 140 may be disposed on an electrical path for connecting the plurality of nodes 111 included in the analog circuits 110 to the control circuit 120. In an example, a plurality of switches included in the switching circuit 140 may be transistors. For example, the switching circuit 140 may include a plurality of MOSFETs or BJTs.

The states of connections between the plurality of nodes 111 included in the analog circuits 110 and the control circuit 120 may be determined depending on the switching state of the switching circuit 140. For example, when the switching circuit 140 is shorted, the control circuit 120 may be electrically connected to the analog circuits 110. In an example, when the switching circuit 140 is open, the control circuit 120 may not be electrically connected to the analog circuits 110.

The output terminal 102 may be electrically connected to a plurality of controllers included in the control circuit 120. In an example, the output terminal 102 may be individually connected to the plurality of controllers included in the control circuit 120, thus enabling electrical states of the analog circuits 110 connected to the control circuit 120 through an electrical path to be tested. For example, the operating states of the analog circuits in the electronic device or the semiconductor circuit may be tested by sensing voltages, which are output through the plurality of nodes 111 included in the analog circuits 110, through the output terminal 102, and by determining whether the sensed voltages fall within the range of voltages output when the analog circuits 110 are normally operated.

Figure 4A:
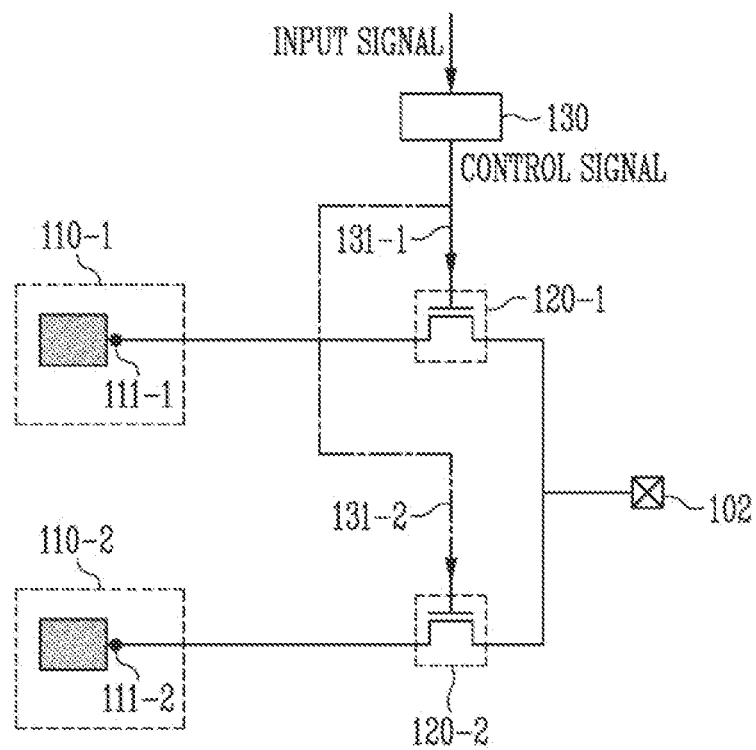
FIG. 4A is a diagram illustrating the operation of a test circuit when a switching circuit is not present according to an embodiment of the present disclosure.

FIG. 4A is a diagram illustrating the operation of a test circuit when the switching circuit 140 is not present according to an embodiment of the present disclosure.

Referring to FIG. 4A, an electronic device may include at least two analog circuits 110-1 and 110-2, at least two nodes 111-1 and 111-2, at least two controllers 120-1 and 120-2, a control signal generator 130, and an output terminal 102.

The control signal generator 130 may receive an input signal from an external device, and may generate a control signal for controlling the at least two controllers 120-1 and 120-2.

The first controller 120-1 may receive a first control signal 131-1 generated by the control signal generator 130. The first controller 120-1 may perform a switching operation based on the first control signal 131-1.

The second controller 120-2 may receive a second control signal 131-2 generated by the control signal generator 130. The second controller 120-2 may perform a switching operation based on the second control signal 131-2.

The first control signal 131-1 and the second control signal 131-2 received by the first controller 120-1 and the second controller 120-2 may be signals generated using external power source that is input to the electronic device. The voltage of the external power source may increase from 0 V to a designated voltage. During a period from the time before the external power source is applied to the electronic device to the time in which the external power source is applied to the electronic device and then the electronic device boots, the first control signal 131-1 and the second control signal 131-2 are generated using the external power source, and thus exact states of the first control signal 131-1 and the second control signal 131-2 cannot be predicted. Therefore, during a power-up period in which the external power source starts to be applied, switching states of the first controller 120-1 and the second controller 120-2 cannot be known. Due thereto, the first controller 120-1 and the second controller 120-2 may perform switching operations regardless of the first control signal 131-1 and the second control signal 131-2. When the first controller 120-1 and the second controller 120-2 are turned on, the first node 111-1 and the second node 111-2 may be connected to each other, whereby the case in which the analog circuits 110-1 and 110-2 are damaged or malfunctioning may occur. In detail, when the voltage received by the first controller 120-1 from external power source does not reach the designated voltage, the first controller 120-1 may not function as a shorted switch even when the first control signal 131-1 is a high signal. In an example, when the voltage received by the second controller 120-2 from external power source does not reach the designated voltage, the second controller 120-2 may not function as an open switch even when the second control signal 131-2 is a low signal.

When the voltages received by the first controller 120-1 and the second controller 120-2 do not reach the designated voltages, the first node 111-1 and the second node 111-2 may be electrically shorted to each other, regardless of the first control signal 131-1 and the second control signal 131-2. Due thereto, the output terminal 102 cannot test the electrical states of the first node 111-1 or the second node 111-2. For example, in the case where the voltages received by the first controller 120-1 and the second controller 120-2 do not reach the designated voltages, the output terminal 102 cannot test (or measure) the electrical state (e.g., the output voltage) of the second node 111-2 when the first control signal 131-1 is a high signal and the second control signal 131-2 is a low signal. Therefore, during an initial period in which the external power source is applied to the electronic device, there is a need to guarantee that the analog circuits 110-1 and 110-2 and the output terminal 102 are definitely prevented from being connected to each other.

Figure 4B:
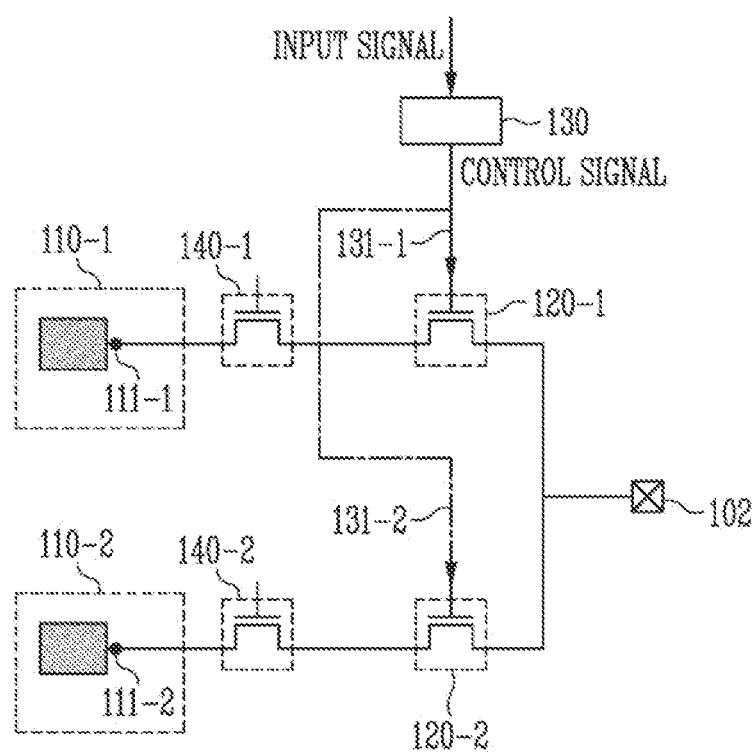
FIG. 4B is a diagram illustrating the operation of a test circuit when a switching circuit is present according to an embodiment of the present disclosure.

FIG. 4B is a diagram illustrating the operation of the test circuit when the switching circuit 140 is present according to an embodiment of the present disclosure.

Referring to FIG. 4B, the electronic device 100 may further include a first switch 140-1 and a second switch 140-2, compared to the electronic device illustrated in FIG. 4A.

The first analog circuit 110-1 and the second analog circuit 110-2 may be some of the analog circuits 110 included in the electronic device 100. Although the above-described analog circuits are designated as the first analog circuit 110-1 and the second analog circuit 110-2, the same description may be made when any two analog circuits included in the analog circuits 110 are selected.

The first switch 140-1 may be disposed on an electrical path for connecting the first node 111-1 included in the first analog circuit 110-1 to the first controller 120-1. In an example, the first switch 140-1 may include all types of hardware components capable of performing a switching operation. For example, the first switch 140-1 may be a transistor such as a MOSFET or a BJT.

According to an example, the second switch 140-2 may be disposed on an electrical path for connecting the second node 111-2 included in the second analog circuit 110-2 to the second controller 120-2. In an example, the second switch 140-2 may be a transistor.

The first controller 120-1 may receive a first control signal 131-1 from the control signal generator 130, and the second controller 120-2 may receive a second control signal 131-2 from the control signal generator 130. The first controller 120-1 and the second controller 120-2 may perform switching operations based on the first control signal 131-1 and the second control signal 131-2.

Each of the first switch 140-1 and the second switch 140-2 may perform a switching operation in response to a switching control signal. That is, the first switch 140-1 and the second switch 140-2 may or may not connect the first controller 120-1 and the second controller 120-2 to the first node 111-1 and the second node 111-2, respectively, in response to the switching control signal.

The first switch 140-1 and the second switch 140-2 may prevent the first node 111-1 and the second node 111-2 from being connected to each other even when the switching states of the first controller 120-1 and the second controller 120-2 are uncertain. Therefore, malfunctioning of the first analog circuit 110-1 and the second analog circuit 110-2 may be prevented, and the voltages of the first node 111-1 and the second node 111-2 may be prevented from being unnecessarily provided to the output terminal 102.

Figure 5:
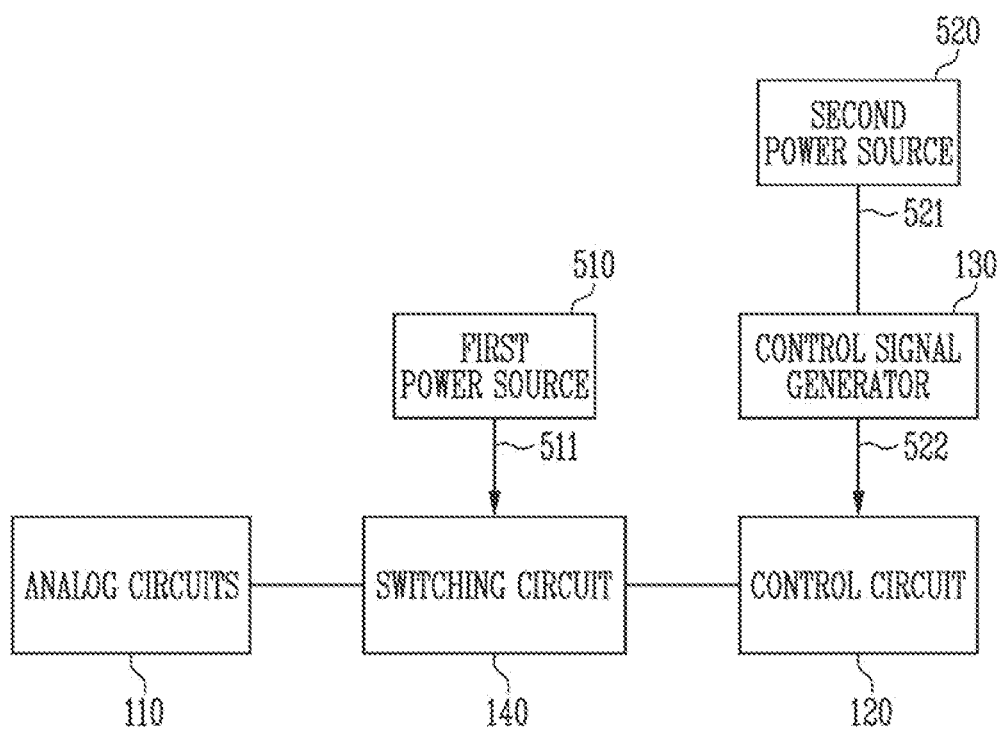
FIG. 5 is a diagram illustrating the operation of a switching circuit and a control circuit supplied with voltages from different power sources according to an embodiment of the present disclosure.

FIG. 5 is a diagram illustrating the operation of the switching circuit 140 and the control circuit 120 supplied with voltages from different power sources according to an embodiment of the present disclosure.

Referring to FIG. 5, analog circuits 110 may be connected to the control circuit 120 through the switching circuit 140, and the state of an electrical connection between the analog circuits 110 and the control circuit 120 may be determined depending on the switching state of the switching circuit 140. FIG. 5 may be understood to be an embodiment of FIG. 3. In FIG. 5, a first power source 510 may be a first external power source 510, and a second power source 520 may be a second external power source 520. Also, a first voltage 511 may be a first external voltage 511, and a second voltage 521 may be a second external voltage 521.

In accordance with an embodiment, the switching circuit 140 may be supplied with the first voltage 511 from the first power source 510. In an example, the first power source 510 may be a source of voltage received from the outside of the electronic device 100.

The control signal generator 130 may receive the second voltage 521 from the second power source 520, and may then generate a control signal 522. The control circuit 120 may receive the control signal 522 generated by the control signal generator 130. In an example, the second power source 520 may be a power source different from the first power source 510. In an embodiment, the second power source 520 may be a default power source used for the operation of the electronic device 100.

The control signal 522 may be a signal for controlling a switching operation of the control circuit 120. Therefore, according to an example, the first voltage 511 received by the switching circuit 140 from the first power source 510 may be maintained at a constant value even while the second voltage 521 output from the second power source 520 is changing during power-up of the second power source 520. In this way, even if the switching circuit 140 and the control circuit 120 receive the voltage from the same voltage source during power-up of the second power source 520, the analog circuits 110 may be prevented from being connected (or shorted) to each other.

That is, because the power source of the control signal for controlling the control circuit 120 and the power source of the switching control signal for controlling the switching circuit 140 are different from each other, the switching circuit 140 may be prevented from being connected to the analog circuits 110 and the control circuit 120 even when the switching state of the control circuit 120 is uncertain due to the state of the second power source 520 applied to the control circuit 120.

According to an example, while the second voltage 521 received by the control circuit 120 from the second power source 520 is changing to a designated voltage, the switching circuit 140 may receive the first voltage 511 having a constant value from the first power source 510, thus maintaining an electrically open state. In an example, even if the control circuit 120 is not correctly operated due to a change in the second voltage 521 received by the control circuit 120, the switching circuit 140 may receive the first voltage 511 having a constant value, and may then function as an open switch. Accordingly, the plurality of nodes included in the analog circuits 110 may be prevented from being electrically shorted to each other.

Figure 6:
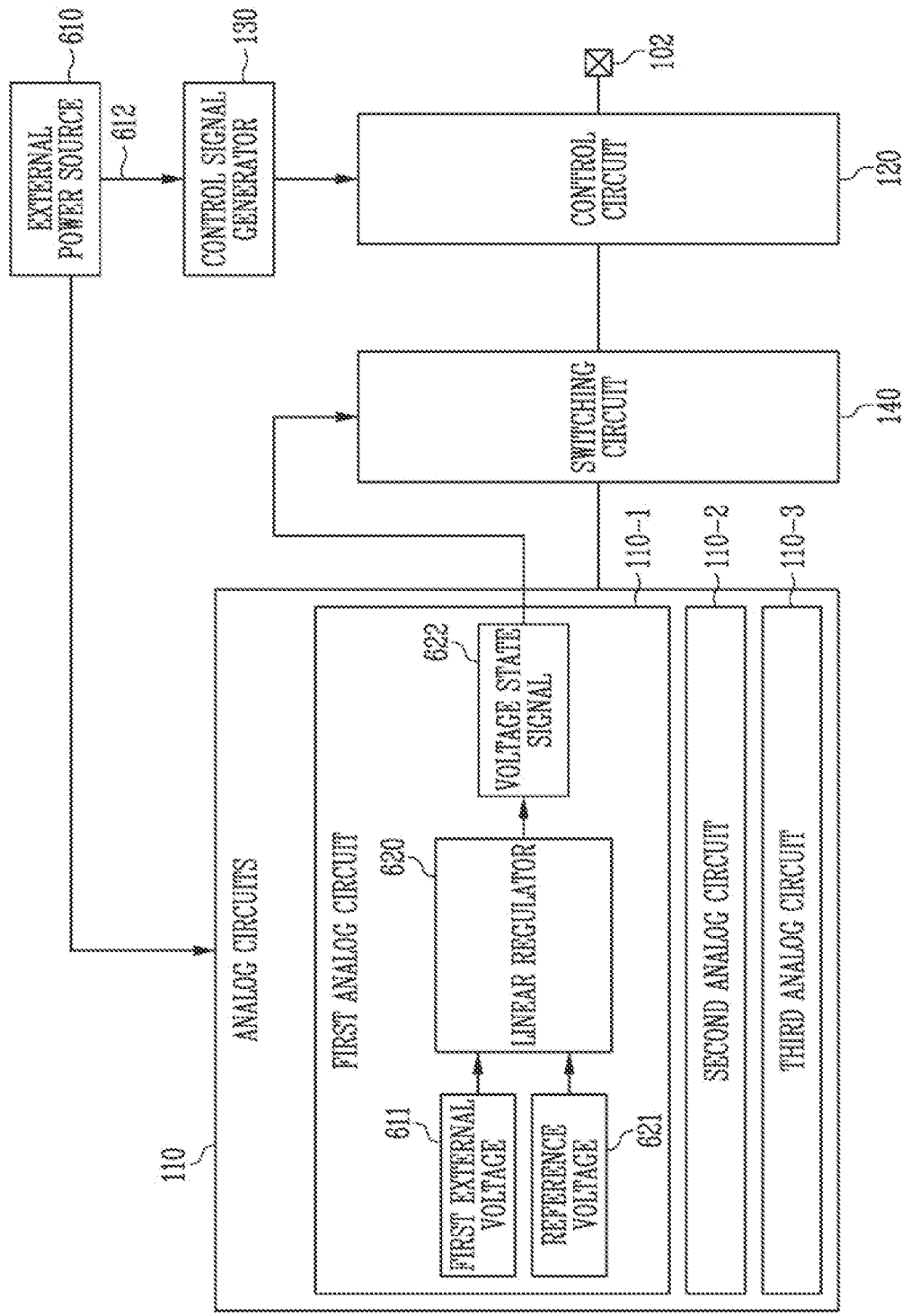
FIG. 6 is a diagram illustrating the operation of a switching circuit operating using the same power source according to an embodiment of the present disclosure.

FIG. 6 is a diagram illustrating the operation of the switching circuit 140 using the same power source according to an embodiment of the present disclosure.

Referring to FIG. 6, analog circuits 110 may be connected to the control circuit 120 through the switching circuit 140, and the state of an electrical connection between the analog circuits 110 and the control circuit 120 may be determined depending on the switching state of the switching circuit 140. FIG. 6 may be understood to be an embodiment of FIG. 3.

In accordance with an embodiment, a voltage from an external power source 610 may be provided to a control signal generator 130 which generates a control signal to be applied to the analog circuits 110 and the control circuit 120.

At least one of the analog circuits 110 may include a linear regulator 620. For example, a first analog circuit 110-1 may include the linear regulator 620. Hereinafter, although an embodiment in which the first analog circuit 110-1 includes the linear regulator 620 is described for convenience of description, the embodiment of the present disclosure is not limited thereto.

A first external voltage 611 output from the external power source 610 may be input to the linear regulator 620 included in the first analog circuit 110-1. For example, the first external voltage 611 may be input to the linear regulator 620 through any one of a plurality of nodes included in the linear regulator 620. The linear regulator 620 may be a low dropout (LDO) regulator. The LDO regulator refers to a linear regulator operating even at a low input/output potential difference.

In accordance with an embodiment, one of the analog circuits 110 may function as a switching control signal generation circuit by outputting a signal to the switching circuit 140 through the linear regulator 620. In an example, the first analog circuit 110-1, which is one of the analog circuits 110, may include the linear regulator 620, and the linear regulator 620 may output a voltage state signal 622 to the switching circuit 140.

The switching circuit 140 may receive the voltage state signal 622 output from the linear regulator 620, and may then perform a switching operation. That is, the switching circuit 140 may receive the voltage state signal 622 output from the linear regulator 620, and may change the on/off state thereof depending on the value of the voltage state signal 622 (e.g., the voltage magnitude of the voltage state signal 622, the amplitude of the voltage state signal 622, or the like).

In an example, the voltage state signal 622 output from the linear regulator 620 may be a signal indicating whether the first external voltage 611, which is the output voltage of the external power source 610, has reached a normal state. In an example, the voltage state signal 622 may be a signal indicating the stable state of the first external voltage 611 output from the external power source 610. For example, the voltage state signal 622 may be a power good signal.

In accordance with an embodiment, the control signal generator 130 may receive a second external voltage 612 output from the external power source 610, and may then generate a control signal for operating the control circuit 120. The voltage state signal 622 received by the switching circuit 140 from the linear regulator 620 may be maintained at a constant value even while the value of the second external voltage 612 is changing during power-up of the external power source 610. In this way, even if the switching circuit 140 and the control circuit 120 receive the voltage from the same voltage source during power-up of the external power source 610, the analog circuits 110 may be prevented from being connected (or shorted) to each other.

Figure 7:
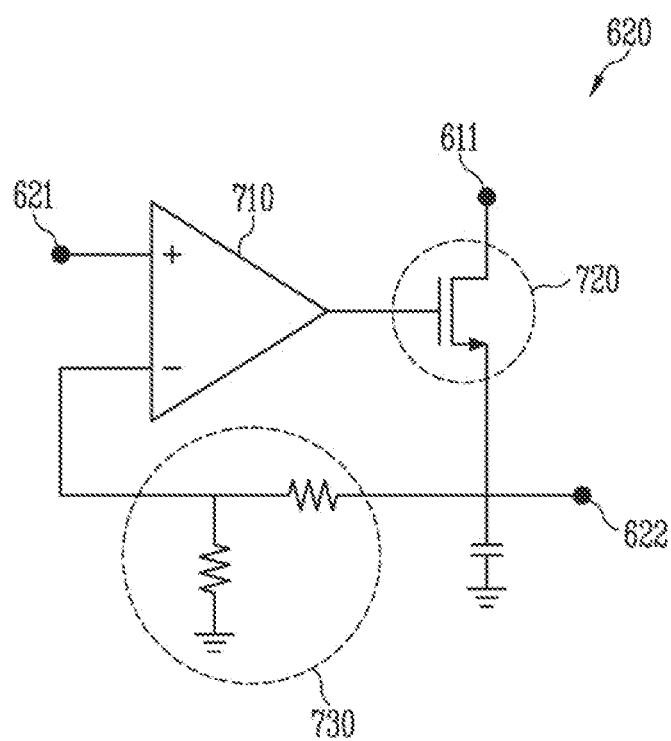
FIG. 7 is a diagram illustrating a circuit configuration of a linear regulator according to an embodiment of the present disclosure.

FIG. 7 is a diagram illustrating a circuit configuration of the linear regulator 620 according to an embodiment of the present disclosure.

Referring to FIG. 7, the linear regulator 620 may include an operational amplifier (OP amp) 710, a transistor 720, and a feedback circuit 730.

A first external voltage 611 input to the linear regulator 620 may be input to one end of the transistor 720. In an example, the transistor 720 may be a MOSFET. When the transistor 720 is a MOSFET, the first external voltage 611 may be VDD.

A reference voltage 621 may be input to a positive terminal (or "+" terminal) of the OP amp 710. Because the reference voltage 621 is a reference voltage used for operation of the linear regulator 620, it may be maintained at a constant value without changing.

The voltage state signal 622 may be input to a negative terminal (or "−" terminal) of the OP amp 710 through the feedback circuit 730. The voltage state signal 622 output from the linear regulator 620 may be input again to one point of the linear regulator 620 through the feedback circuit 730, thus resulting in a feedback effect. That is, the output of the linear regulator 620 becomes the input of the linear regulator 620 through the feedback circuit 730, and thus the voltage state signal 622 may be adjusted.

In accordance with the present disclosure, there may be provided a test circuit of a semiconductor device, which is capable of preventing the occurrence of malfunctioning, the semiconductor device including the test circuit, and an operating method thereof.

The present disclosure described above is not limited by the aforementioned embodiment and the accompanying drawings, and it will be apparent to those skilled in the art to which the present disclosure pertains that various replacements, modifications, and changes can be made without departing from the technical spirit of the present disclosure and the following claims. Furthermore, the embodiments may be combined to form additional embodiments.

What is claimed is:

1. An electronic device comprising:
   analog circuits;
   a control circuit configured to connect, to an output terminal, each of a plurality of nodes respectively included in the analog circuits;
   a control signal generator configured to generate a control signal for controlling the control circuit based on an input signal received from an external device; and
   a switching circuit disposed on an electrical path for connecting the plurality of nodes and the control circuit to each other and configured to be electrically open during a preset time amount from a time point at which a voltage from an external power source starts to be applied to the control circuit.

2. The electronic device according to claim 1, wherein the control circuit comprises a plurality of controllers configured to connect the respective nodes to the output terminal.

3. The electronic device according to claim 2, wherein each of the plurality of controllers is a transistor configured to receive the control signal through a gate electrode thereof.

4. The electronic device according to claim 2, wherein the switching circuit comprises a plurality of switches electrically connected between the plurality of nodes and the plurality of controllers, respectively.

5. The electronic device according to claim 4, further comprising a switching control signal generator configured to generate a switching control signal to be commonly provided to the plurality of switches.

6. The electronic device according to claim 4, wherein the analog circuits are configured to generate a switching control signal to be commonly provided to the plurality of switches.

7. The electronic device according to claim 1, wherein the switching circuit and the control circuit are configured to receive respective power supplies from different external power sources.

8. The electronic device according to claim 1, wherein the switching circuit and the control circuit are configured to receive respective power supplies from an identical external power source.

9. The electronic device according to claim 8, wherein one of the analog circuits includes a linear regulator configured to output, when a level of the external power source reaches a reference level, a voltage state signal to provide the voltage state signal to the switching circuit.

10. The electronic device according to claim 1, wherein the output terminal is an analog test bus.

11. A test circuit for controlling a test operation for analog circuits, the test circuit comprising:
    a control circuit configured to connect, to an output terminal, each of a plurality of nodes respectively included in the analog circuits;
    a control signal generator configured to generate a control signal for controlling the control circuit based on an input signal received from an external device; and
    a switching circuit disposed on an electrical path for connecting the plurality of nodes and the control circuit to each other and configured to be electrically open during a preset time amount from a time point at which a voltage from an external power source starts to be applied to the control circuit.

12. The test circuit according to claim 11, wherein the control circuit comprises a plurality of controllers configured to connect the respective nodes to the output terminal.

13. The test circuit according to claim 12, wherein each of the controllers is a transistor configured to receive the control signal through a gate electrode thereof.

14. The test circuit according to claim 12, wherein the switching circuit comprises a plurality of switches electrically connected between the plurality of nodes and the plurality of controllers, respectively.

15. The test circuit according to claim 14, further comprising a switching control signal generator configured to generate a switching control signal to be commonly provided to the plurality of switches.

16. The test circuit according to claim 14, wherein the analog circuits are configured to generate a switching control signal to be commonly provided to the plurality of switches.

17. The test circuit according to claim 11, wherein the switching circuit and the control circuit are configured to receive respective power supplies from different external power sources.

18. The test circuit according to claim 11, wherein the switching circuit and the control circuit are configured to receive respective power supplies from an identical external power source.

19. The test circuit according to claim 11, wherein the output terminal is an analog test bus.

20. A circuit comprising:
   first and second switches disposed on a path between first and second nodes;
   a first control circuit configured to turn on the first switch by generating a first control signal having a transient state at a beginning of external power supply; and
   a second control circuit configured to turn on, by generating a second control signal having a steady state, the second switch after keeping the second switch turned off until the first control signal becomes to have a steady state.

* * * * *